(12) United States Patent
Kfouri et al.

(10) Patent No.: US 7,856,342 B1
(45) Date of Patent: Dec. 21, 2010

(54) AUTOMATIC REINFORCEMENT MODELING

(75) Inventors: Emile E. Kfouri, Newton, MA (US); Tim Culver, Waltham, MA (US)

(73) Assignee: Autodesk, Inc., San Rafael, CA (US)

( * ) Notice: Subject to any disclaimer, the term of this patent is extended or adjusted under 35 U.S.C. 154(b) by 227 days.

(21) Appl. No.: 11/619,565

(22) Filed: Jan. 3, 2007

Related U.S. Application Data (60) Provisional application No. 60/827,834, filed on Oct. 2, 2006.

(51) Int. Cl.
*G06F 17/50* (2006.01)

(52) U.S. Cl. .................................. 703/1; 703/6

(58) Field of Classification Search ............... 345/420; 703/1, 6, 7, 8; 700/97, 98, 182
See application file for complete search history.

(56) References Cited

U.S. PATENT DOCUMENTS

| | | | |
|---|---|---|---|
| 5,268,998 A | 12/1993 | Simpson | |
| 5,444,836 A | 8/1995 | Hollingsworth et al. | |
| 5,557,537 A | 9/1996 | Normann et al. | |
| 5,856,828 A | 1/1999 | Letcher, Jr. | |
| 5,923,573 A | 7/1999 | Hatanaka | |
| 6,052,691 A | 4/2000 | Ardoin et al. | |
| 6,426,745 B1 | 7/2002 | Isaacs et al. | |
| 6,477,518 B1 | 11/2002 | Li et al. | |
| 6,629,065 B1 | 9/2003 | Gadh et al. | |
| 6,651,037 B1 | 11/2003 | Hall et al. | |
| 6,683,620 B1 | 1/2004 | Burke | |
| 6,799,463 B2 | 10/2004 | Fields et al. | |
| 6,816,819 B1 | 11/2004 | Loveland | |
| 6,859,768 B1 * | 2/2005 | Wakelam et al. ............... 703/1 |
| 7,162,706 B2 | 1/2007 | Kuang et al. | |
| 7,246,044 B2 | 7/2007 | Imamura et al. | |
| 7,292,908 B2 | 11/2007 | Borne et al. | |
| 7,343,273 B2 | 3/2008 | Kusunoki et al. | |
| 2001/0033281 A1 | 10/2001 | Yoshida et al. | |
| 2003/0139907 A1 | 7/2003 | McCarthy | |
| 2003/0200062 A1 | 10/2003 | Dessureault et al. | |
| 2003/0208341 A9 | 11/2003 | Simmons et al. | |
| 2003/0229478 A1 | 12/2003 | Rappaport et al. | |
| 2004/0122635 A1 | 6/2004 | Uraki | |
| 2004/0145614 A1 * | 7/2004 | Takagaki et al. ............ 345/964 |

(Continued)

FOREIGN PATENT DOCUMENTS

EP        1223520        7/2002

(Continued)

OTHER PUBLICATIONS

Jae-Jun Kim et al., "Designing bar-mesh modules of reinforced concrete structures", 1998, Elsevier Science Ltd., pp. 319-337.*

(Continued)

*Primary Examiner*—Jason Proctor
(74) *Attorney, Agent, or Firm*—Fish & Richardson P.C.

(57) ABSTRACT

Methods and program products for presenting a view of physical element, the physical element represented in a computer aided design (CAD) model, and integrating a presentation of structural reinforcement of the physical element into the view of the physical element.

18 Claims, 9 Drawing Sheets

U.S. PATENT DOCUMENTS

| | | | |
|---|---|---|---|
| 2004/0153824 A1 | 8/2004 | Devarajan et al. | |
| 2004/0239494 A1 | 12/2004 | Kennedy et al. | |
| 2005/0038636 A1 | 2/2005 | Wakelam et al. | |
| 2005/0071394 A1 | 3/2005 | Martyn et al. | |
| 2005/0131924 A1 | 6/2005 | Jones | |
| 2005/0209831 A1 | 9/2005 | Jungreis et al. | |
| 2006/0119601 A1 | 6/2006 | Finlayson et al. | |
| 2006/0143220 A1 | 6/2006 | Spencer | |
| 2006/0208169 A1 | 9/2006 | Breed et al. | |
| 2006/0230351 A1 | 10/2006 | Stehle et al. | |
| 2007/0063378 A1 | 3/2007 | O'Donoghue | |
| 2007/0091119 A1 | 4/2007 | Jezyk et al. | |
| 2007/0174026 A1 | 7/2007 | Mangon et al. | |
| 2007/0174027 A1 | 7/2007 | Moiseyev | |
| 2007/0179759 A1 | 8/2007 | Mangon | |
| 2007/0179976 A1 | 8/2007 | Arvin et al. | |
| 2007/0219764 A1 | 9/2007 | Backe | |
| 2007/0282892 A1 | 12/2007 | Bailly et al. | |
| 2007/0285424 A1 | 12/2007 | Cheng et al. | |
| 2008/0077364 A1 | 3/2008 | Wakelam et al. | |
| 2008/0243269 A1* | 10/2008 | Townsend et al. | 700/32 |

FOREIGN PATENT DOCUMENTS

| | | |
|---|---|---|
| WO | WO 02/08975 | 1/2002 |
| WO | WO 03/100555 | 12/2003 |

OTHER PUBLICATIONS

International Search Report for PCT Application No. PCT/US08/58746, dated Aug. 15, 2008.
U.S. Appl. No. 11/460,524, filed Jul. 27, 2006, Kfouri et al.
U.S. Appl. No. 11/695,535, filed Apr. 2, 2007, Culver et al.
Autodesk, Inc., International Search Report and the Written Opinion of the International Searching Authority dated Aug. 31, 2007 for International Patent Application No. PCT/US2007/064009 filed Mar. 14, 2007.
ESS: "Klima2000 Handbuch—Schritt für Schritt (Excerpt: Kapitel 10)", Klima 2000, 1999, pp. 10-1 to 10-45.
Parametric Technology Corporation, "Getting Started with Pro/Engineer(R) 2001," 2001, Parametric Technology Corporation, pp. 1-192.
Autodesk Inc., "AutoCAD Architectural Desktop (tm) User's Guide," 1999, Autodesk Inc., Release 2, pp. 1-xxiv; 1-8; 219-296.
Ramon F. Sarraga, "Modifying CAD/CAM surfaces according to displacements prescribed at a finite set of points," Computer-Aided Design vol. 36, Issue 4, Feb. 2004, pp. 343-349.
H.N. Gürsoy, "Tetrahedral Finite Elemento Mesh Generation from NURBS Solid Models," Engineering with Computers (1996), (12), pp. 211-223.
Office Action dated Dec. 24, 2008 for U.S. Appl. No. 11/341,229.
Office Action dated May 14, 2009 for U.S. Appl. No. 11/341,229.
Autodesk Revit Building 8.1 User Guide, Aug. 2005, AutoDesk, Inc., http://images.autodesk.com/adsk/files/Autodesk_Revit_Building_8.1_Help.pdf.
International Preliminary Report on Patentability for PCT Application No. PCT/US2007/064009, dated Sep. 25, 2008, 13, pages.
Non-Final Office Action dated Oct. 6, 2008 for U.S. Appl. No. 11/345,436, 12 pages.
Non-Final Office Action dated Oct. 17, 2008 for U.S. Appl. No. 11/341,228, 22 pages.
Non-Final Office Action dated Feb. 17, 2009 for U.S. Appl. No. 11/619,565, 16 pages.
Final Office Action dated May 15, 2009 for U.S. Appl. No. 11/345,436, 12 pages.
Final Office Action dated Jun. 1, 2009 for U.S. Appl. No. 11/341,228, 17 pages.
Non-Final Office Action dated Sep. 8, 2009 for U.S. Appl. No. 11/619,565, 15 pages.
Non-Final Office Action dated Sep. 18, 2009 for U.S. Appl. No. 11/614,049, 16 pages.
Non-Final Office Action dated Dec. 2, 2009 for U.S. Appl. No. 11/341,228, 28 pages.
Non-Final Office Action dated Dec. 24, 2009 for U.S. Appl. No. 11/619,565, 16 pages.
Non-Final Office Action dated Jan. 28, 2010 for U.S. Appl. No. 11/614,049, 10 pages.

* cited by examiner

AUTOMATIC REINFORCEMENT MODELING

CROSS-REFERENCE TO RELATED APPLICATIONS

This application claims priority to pending U.S. Patent Application No. 60/827,834, entitled AUTOMATIC REINFORCEMENT MODELING, to inventors Emile Kfouri, et al, which was filed on Oct. 2, 2006. The disclosure of the above application is incorporated herein by reference in its entirety.

The following related applications are incorporated by reference in their entirety:

U.S. patent application Ser. No. 11/340,082, entitled SYNCHRONIZED PHYSICAL AND ANALYTICAL REPRESENTATIONS OF A CAD MODEL, filed on Jan. 25, 2006; and U.S. patent application Ser. No. 11/341,229, entitled SYNCHRONIZED ARCHITECTURAL AND STRUCTURAL CAD MODELS, filed on Jan. 26, 2006.

BACKGROUND

Computer Aided Design (CAD) software tools are commonly used to prepare a CAD model or models representing a structure, such as a building. A CAD model can incorporate a physical model, i.e., representations of physical elements, such as columns, beams, slabs, walls, and the like that will be included in the structure. Drawings prepared from such a model can be used in the actual physical construction of the corresponding structure. The CAD model may be prepared and edited by various individuals, including architects and structural engineers. As part of a design stage, a structural analysis is typically performed on elements that will be included in the structure, for example, to ensure that there is sufficient load bearing capacity.

Structural analysis software is available to perform analysis of a CAD model. Conventional structural analysis software receives as input an analytical representation of a physical structure. An analytical representation is typically different than a representation of the physical elements, e.g., columns, beams, etc. It is an idealized mathematical model that may represent only a portion of a structure such as one floor of a building. For example, an analytical representation may be a wire frame representation of the physical elements, and the wire frame elements can include or be associated with properties (e.g., weight, moment of inertia, cross-sectional area), member connectivity and/or end conditions (e.g., pinned, free, fixed). Typically, the analytical representation is prepared separately and is used for the structural analysis and perhaps other types of analyses that are performed in the design stage.

The analytical representation can be subjected to load simulation in a structural analysis program, for example, to identify stress levels in the various physical elements. On the basis of the analysis, analytical elements in the analytical representation may be modified (e.g., resized or other properties changed) and the analytical representation reanalyzed in an iterative fashion. The results of the analysis can be used to update corresponding physical elements in the CAD model. Analytical representations can be automatically generated from a CAD model.

In the typical design of concrete floor slabs and walls there is a need to incorporate into the CAD model a large number of physical reinforcement elements such as steel bars ("rebar") which serve to strengthen the concrete. However, the process of manually creating each reinforcement element in a CAD tool can be tedious and error prone. Additionally, changes in geometry of slabs or walls may require a labor intensive reconfiguration of the reinforcement elements. Some CAD tools represent reinforcement elements as fully modeled three-dimensional (3D) physical elements. While this allows for accurate renderings in plan and cut sections, much of the layout and editing of reinforcement elements is typically done manually. Moreover, because of the complexity of 3D models, there is tremendous overhead in manipulating CAD models with even a modest number of reinforcement objects.

SUMMARY

In general, one aspect of the subject matter described in this specification can be embodied in a method that includes presenting a view of physical element, the physical element being represented in a computer aided design (CAD) model. A presentation of structural reinforcement of the physical element is integrated into the view of the physical element. And the structural reinforcement is not represented as a physical element in the CAD model. Other embodiments of this aspect include corresponding systems, apparatus, and computer program products.

These and other embodiments can optionally include one or more of the following features. The presentation of the structural reinforcement is apparent when the view exposes no interior portion of the physical element. The presentation of the structural reinforcement is apparent when the view exposes one or more interior portions of the physical element. The presentation of the structural reinforcement accommodates one or more openings in the physical element. The structural reinforcement represents concrete or frame reinforcement. The physical element is one of: a wall, a floor slab, and a column. The presentation of the structural reinforcement can be automatically modified to reflect a modification to the physical element.

In general, another aspect of the subject matter described in this specification can be embodied in a method that includes presenting a view of physical element, the physical element being represented in a computer aided design (CAD) model. A presentation of structural reinforcement of the physical element is integrated into the view of the physical element. User input is accepted to modify the physical element. The presentation of the structural reinforcement to is automatically modified reflect the modification of the physical element. And the structural reinforcement is not represented as a physical element in the CAD model. Other embodiments of this aspect include corresponding systems, apparatus, and computer program products.

These and other embodiments can optionally include one or more of the following features. The presentation of the structural reinforcement is apparent when the view exposes no interior portion of the physical element. The presentation of the structural reinforcement is apparent when the view exposes one or more interior portions of the physical element. The presentation of the structural reinforcement accommodates one or more openings in the physical element. The structural reinforcement represents concrete or frame reinforcement. The physical element is one of: a wall, a floor slab, and a column.

Particular embodiments of the invention can be implemented to realize one or more of the following advantages. Reinforcement structures can be rendered without requiring them to be modeled. Reinforcement structures can automatically reconfigure themselves to accommodate changes to their host physical element. Concrete and frame reinforcement structures can be represented in a host element. Information from an analysis application can be imported to automatically create reinforcement structures. Likewise, reinforcement structure information can be automatically exported to analysis applications. Rendering of reinforcement structures in different views is fast since the structures are not modeled. Reinforcement structures can be "cut" by a view (e.g., a sectional view) and render themselves properly for the view.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

A CAD model can be created using an interactive CAD tool, for example, or a CAD model can be obtained from one or more files, object-oriented databases, relational databases, distributed objects, combinations of these, or other suitable storage. In some implementations, the CAD tool is Autodesk® Revit® Structure, available from Autodesk, Inc. of San Rafael, Calif. A CAD model can incorporate a physical model that represents one or more physical elements (e.g., floor slab, wall, column, or other elements) of one or more physical structures, such as buildings. A plurality of properties can be associated with each physical element that can detail the location and geometry of the element, the manner of connectivity of the element to other elements, materials used to realize the element (e.g., concrete, wood, steel), geometry of any openings in the element (e.g., windows, doors, stairways, or heating and ventilation ducts), and other suitable properties.

Figure 1A:
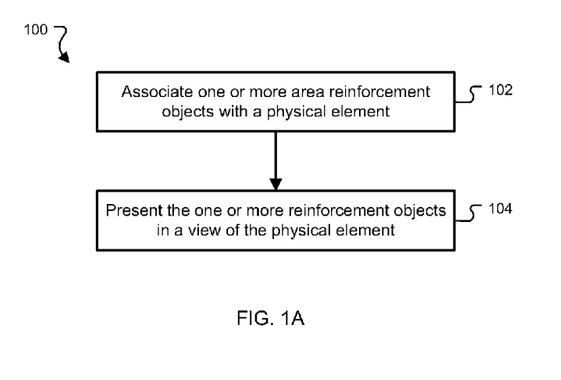
FIG. 1A is a flow chart illustrating a method for associating one or more AROs with a physical element.
Figure 1B:
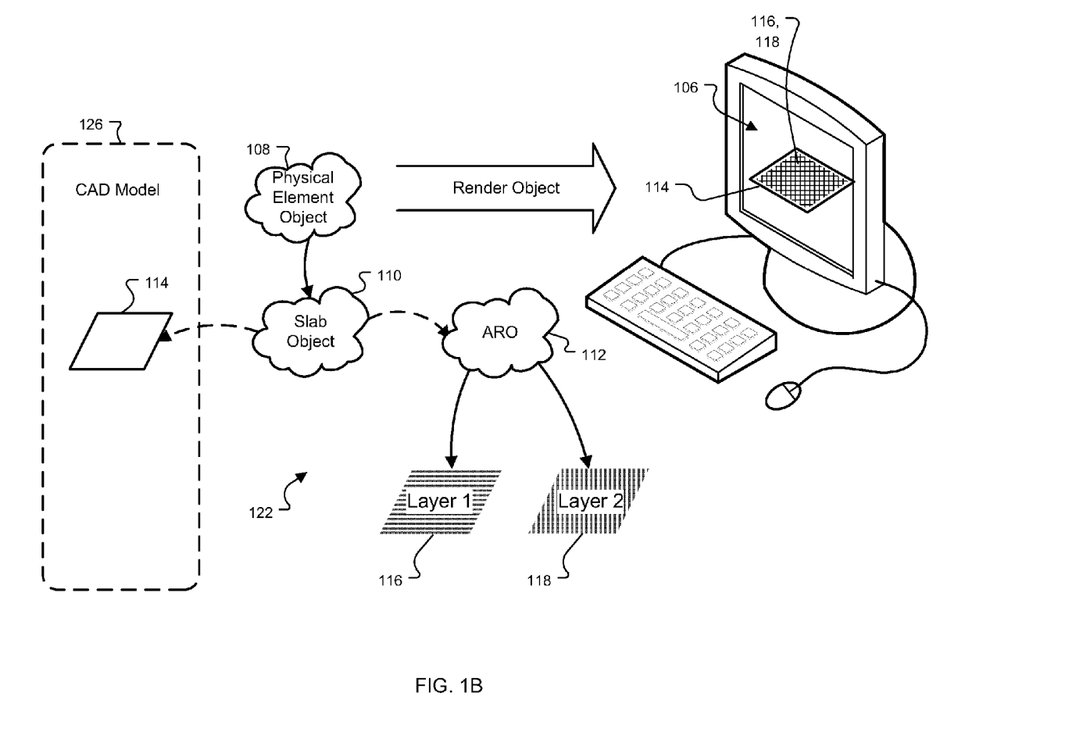
FIG. 1B shows a representation of a physical slab element.

FIG. 1B illustrates a representation 122 of a physical slab element. In some implementations, physical elements and other entities can be programmatically represented as instances of classes (i.e., objects) in an object-oriented programming language. For example, a physical element object 108 is associated slab object 110 that corresponds to a floor slab physical element 114 in a CAD model 126. The slab object 110 can be associated with one or more child objects representing physical elements to be composed with the slab element 114. For example, the slab object 110 may have one or more child objects representing openings in the slab to accommodate stairways.

In order to represent reinforcement structures within physical elements, objects representing physical elements, such as the slab object 110, can be associated with one or more area reinforcement objects (AROs), such as ARO 112. An ARO models a reinforcement structure such as rebar or frame components within one or more interior portions of the associated object's corresponding physical element. An ARO does not represent physical reinforcement element(s) in the CAD model 126, however. This enables AROs to be "lightweight" elements that can quickly render reinforcement structures in views of the CAD model 126.

In this example, ARO 112 represents rebar reinforcement of the floor slab 114. An ARO can have different properties depending on the type of reinforcement structure the ARO is representing. In some implementations, an ARO for rebar reinforcement can include properties specifying the number of reinforcement layers (e.g., graphically depicted as 116, 118), the arrangement of bars within a layer, bar size, bar spacing, whether the ends of bars are hooked, the orientation of layers in relation to each other (e.g., bars in one layer are perpendicular to bars in another layer creating an overall grid pattern), the location of each layer within an interior portion of the physical element, the concrete cover thickness, and other suitable properties. Layers (e.g., 116 and 118) can be automatically or interactively arranged, and the number of layers can be dependant upon the tensile and the compressive stresses in the concrete, and the thickness of the concrete.

An ARO's properties can be obtained from a user through CAD tool input. For instance, users can specify through a CAD tool graphical user interface that reinforcement of a physical element such as a floor slab will have two opposing layers of rebar, with a bar spacing of ten inches and a bar diameter of one inch. There is no need for users to manually create or configure each rebar as this is done automatically by an ARO for the physical element. Alternatively, ARO properties can be determined automatically based on structural or stress analysis of the CAD model, construction codes, or a combination of these. For example, an analysis of the CAD model can determine the amount of stress in concrete (e.g., floor slab 114) and the amount of reinforcement required to handle the stress. Construction codes can dictate the minimum and maximum bar spacing, bar size, and the number of layers, for instance.

It is often desirable in building construction to connect physical elements through the physical element's reinforcement structures. For example, a concrete wall and an underlying concrete floor slab can be connected to one another by connecting the rebar in the wall with the rebar in the floor. Rebar can extend down from the wall and bend into the floor slab so that the wall and the floor are joined. In some implementations, two connected reinforcement structures are represented by three AROs: one for each physical host element, and one to connect the two reinforcement structures. In some implementations, users can specify that a reinforcement structure in one physical element should be connected to the reinforcement structure in another physical element by interactively laying down a path of reinforcement. Alternatively, reinforcement structures of adjacent physical elements can be automatically joined. In some implementations, ARO objects by default will model reinforcement for an entire physical object. This behavior can be overridden such that only a smaller portion or portions of a physical element are reinforced.

In some implementations, ARO objects can be used to render the reinforcement they represent in CAD model views of physical elements and in construction drawings. Since there are no physical elements in the CAD model 126 to represent reinforcement structures, the CAD tool uses AROs to render depictions of reinforcement structures as needed in a graphical presentation of a view (e.g., 106) of a physical element (e.g., 114). For example, rendering of rebar can be in a cutaway section of a physical element where one or more interior portions of the physical element are exposed. AROs render reinforcement structures such that they appear integrated within a physical element at the correct location(s). In some implementations, the view 106 may not show an interior region of a physical element 114, and in that case the view 106 can optionally indicate that there is a reinforcement structure within the physical element 114, for example, by using dashed lines (e.g., for rebar) or other indicators to denote the hidden reinforcement structure.

For example, ARO 112 has two orthogonal rebar layers defined, depicted as 116 and 118 in FIG. 1B. The layers 116 and 118 each have a position within the slab 114 for purposes of presenting graphical views in a CAD tool and creating construction drawings. The view 106 shows the physical element 114 with both of the rebar layers 116 and 118 rendered. The CAD tool enables users to interactively manipulate the physical element 114 in the view 106. For example, users can zoom in or out, rotate, scale, translate and view cut-away portions of physical elements and the reinforcement structure(s) are automatically presented appropriately for orientation of the physical element and the view.

FIG. 1A is a flow chart illustrating a method 100 for associating one or more AROs (e.g., 112) with a physical element (e.g., 114). For a given CAD model, AROs can be manually or automatically associated with the physical element (step 102), as described above. For example, a CAD tool allows users to interactively select a physical element (e.g., 114) in a view (e.g., 106) and associate an ARO (e.g., 112) with the selected physical element (e.g., 114) by selecting a menu item, for example. Alternatively, the CAD tool can automatically create and associate AROs with physical elements as the physical elements are created. Generally speaking, a physical element serves as a logical host element for one or more AROs. The association of one or more AROs with a physical element obviates the need to actually create physical elements to model the reinforcement structure. The one or more reinforcement objects are then presented in the view 106 of the physical element (step 104).

Figure 2A:
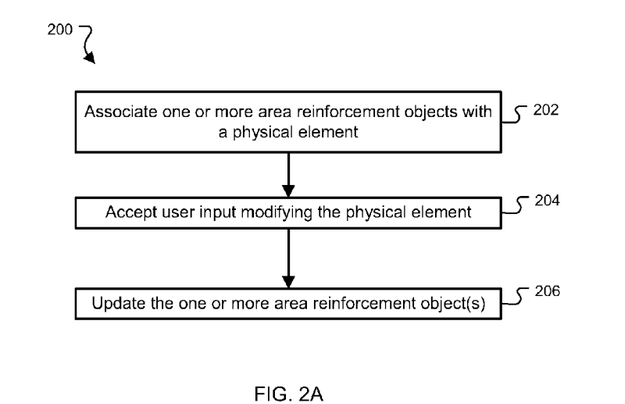
FIG. 2A is a flow chart illustrating a method for updating one or more AROs associated with a physical element.
Figure 2B:
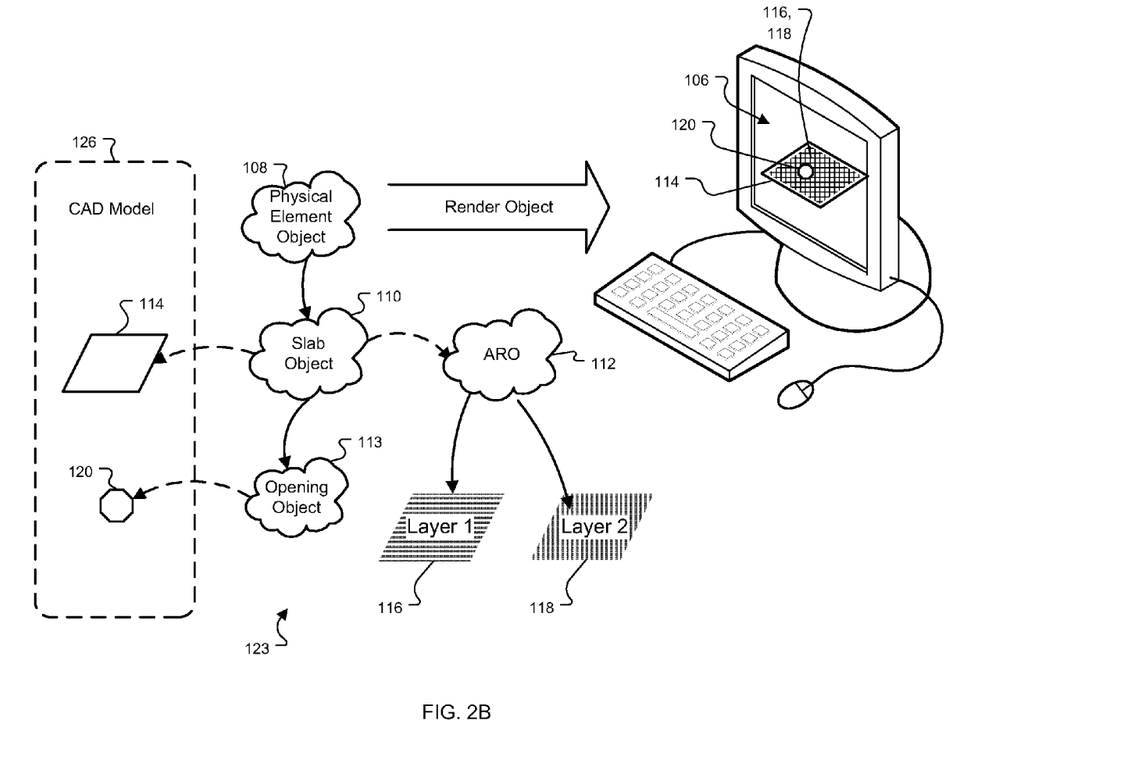
FIG. 2B shows a representation of a physical slab element with an opening.

FIG. 2B illustrates a representation 123 of a physical slab element 114 with an opening 120. The slab object 110 is associated with one child objects 113 representing an opening physical element 120 to be composed with the slab 114. For example, the opening 120 might be for a stairwell or for plumbing. The opening 120 itself may be composed of multiple physical elements, and so on. AROs automatically adapt their reinforcement structure rendering to changes in their host element. For example, in the view 106 the rebar layers 116 and 118 are drawn to accommodate the hole 120 in the floor slab 114. No matter which view of the floor slab 114 is presented, the reinforcement structure represented by the ARO 112 will be correctly rendered. Moreover, users do not have to manually modify reinforcement elements whenever a host element is changed because there are none to modify. AROs can dynamically adjust their properties (e.g., size, number and configuration of reinforcement elements) and renderings to accommodate geometry changes in their host element without requiring user intervention. For example, if a second opening is added to the slab 114, the rebar layers 116 and 118 would automatically be rendered to accommodate both openings.

FIG. 2A is a flow chart illustrating a method 200 for updating one or more AROs (e.g., 112) associated with a physical element (e.g., 114). After a structural reinforcement for a physical element has been defined, one or more AROs (e.g., 112) can be associated with the physical element (step 202) and the physical element becomes the host for the AROs. User input is accepted to modify the physical element (step 204). For example, if the physical element is a wall, the wall can be resized by the user and openings for windows and doors (e.g., 120) can be added. The AROs are updated automatically in response to the modification (step 206) to accommodate changes in the host. For example, ARO properties can be updated so that the ARO can correctly render a reinforcement structure around openings in the ARO's host structure.

Figure 3A:
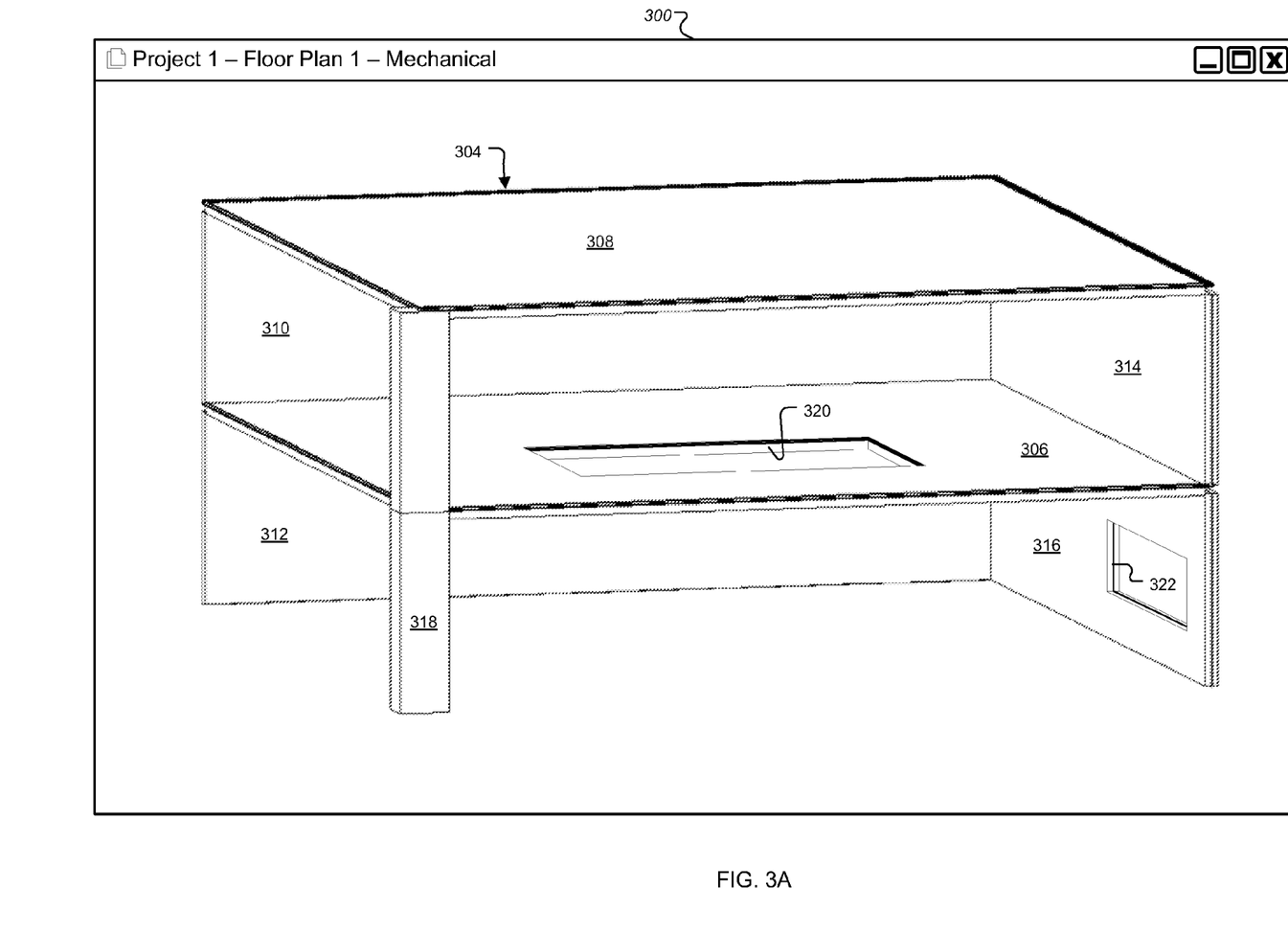
FIG. 3A shows an interactive view of a structure that includes a plurality of physical elements.

FIG. 3A shows an interactive view 300 of a structure 304 that includes a plurality of physical elements. The view 300 can be presented by an interactive CAD software tool that allows users to interactively view, create, import, export, manipulate, and modify one or more CAD models. More than one view of a given physical element can be presented simultaneously. Although the view 300 presents an isometric view of the structure 304, other views are possible, such as a plan view, an orthographic projection, a diametric projection, a trimetric projection, an oblique projection, combinations of these, or other views. The view 300 of the structure 304 shows a concrete floor slab 306, a concrete floor slab 308, a plurality of concrete walls 310, 312, 314, and 316, and a concrete column 318 that are defined as physical elements in the CAD model 126. Additionally, the view 300 shows openings 320 and 322 in the physical elements 108 that define the floor slab 306 and the wall 316, respectively.

Figure 3B:
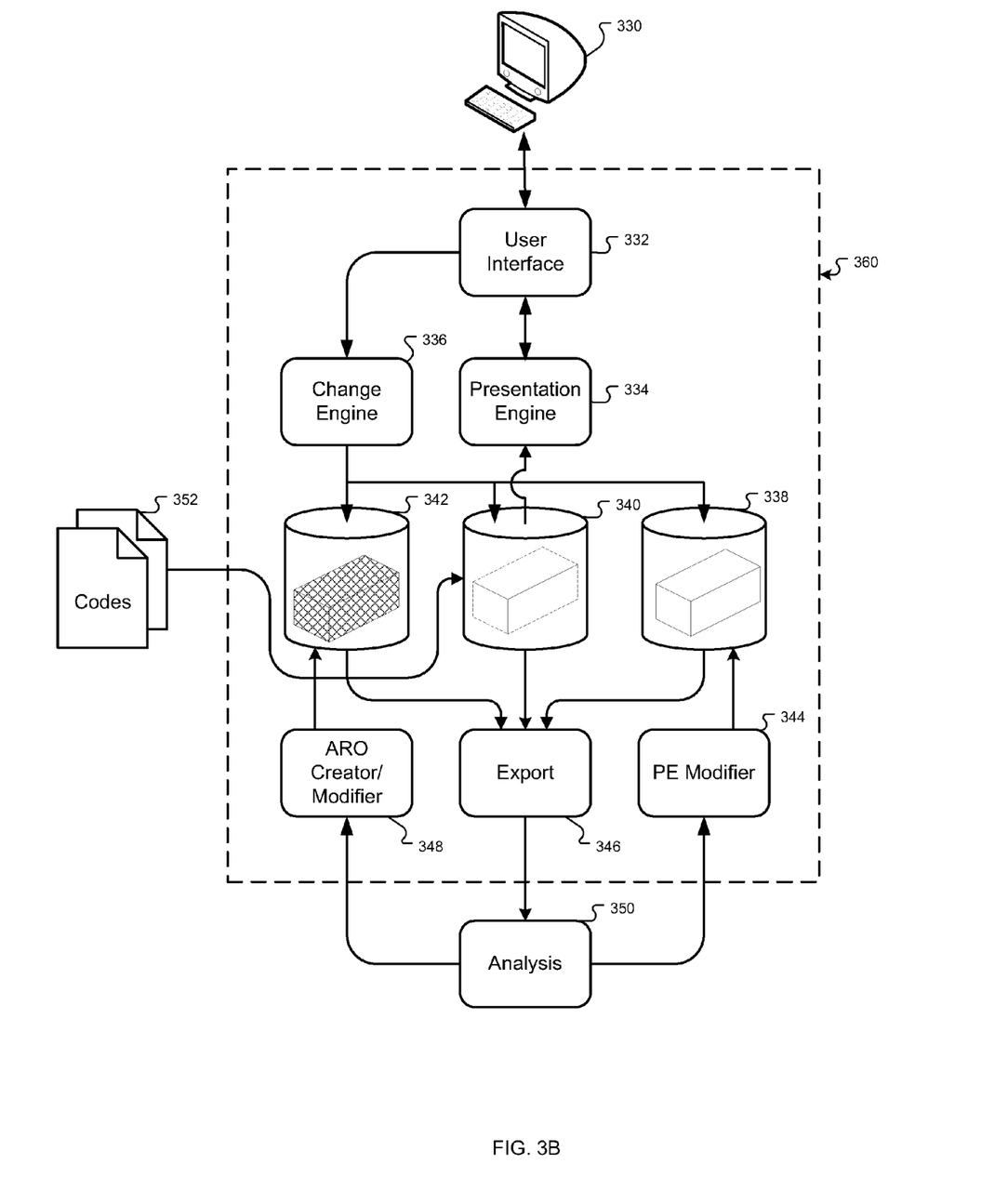
FIG. 3B is a block diagram of a system as might be implemented by a CAD tool.

FIG. 3B is a block diagram of a system 360 as might be implemented by a CAD tool. Users can interact with the system 360 through one or more input/output devices 330 such as a keyboard, a display, a mouse, a speaker, a digital camera, a microphone, or other suitable devices. A user interface component 332 can accept user input from, and provide output to, the input/output devices 330. For example, the user interface component 332 can interact with users through a graphical user interface (GUI) that utilizes a display device 330. In some implementations, the GUI is provided as part of the Microsoft Windows XP operating system, available from Microsoft Corp. of Redmond, Wash.

Views of one or more physical elements 338, one or more associated analytical representations of the physical elements 340, and one or more associated reinforcement structures represented by AROs 342 can be generated by the presentation engine component 334 and provided to the user interface component 332 for presentation on a display 330. The presentation engine component 334 can provide views in response to requests from the user interface component 332. The user interface component 332 can in turn present the views to users through the GUI, for example. Physical elements 338, analytical representations 340 and AROs 342 can be persisted in data structures or objects in memory, one or more files, one or more databases, or other persistent or non persistent storage, and combinations of these.

The user interface component 332 can accept user input from the devices 330 (e.g., by invoking GUI functions) and provide such to the change engine component 336. The change engine component 336 is responsible for propagating changes made to physical elements, analytical elements, or reinforcement structures, for example, through user interaction with a view, to the affected physical elements 338, analytical representations 340 and AROs 342. For example, a user may change the location of a wall in a view of a CAD model. The corresponding physical element's location property will be updated to reflect the change, as well as any corresponding analytical representation (if any) and any ARO hosted by the wall (if any). The presentation engine component 334 reacts to updates by causing any views which are affected by the updates to be regenerated by the presentation engine 334 and provided to the user interface component 332.

By way of illustration, a user can interactively move opening 320 in view 300 to a different location on floor slab 306. For example, the user can move the opening 320 by a drag-and-drop mouse operation. As the user is moving the opening 320, or after the moving, the user interface component 332 notifies the change engine component 336. The change component 336 in turn modifies (or causes to be modified) the location property of the opening 320 physical element in the physical elements 338, and any corresponding analytical elements 340. As a further result of the move, the change component 336 modifies (or causes to be modified) affected AROs 342 hosted by the floor slab 306 so that the affected AROs will be reconfigured to accommodate the new location of the opening 320. Once changes are propagated, the presentation engine component 334 can generate one or more updated views (which may include a depiction of the modified reinforcement structures) for the user interface component 332 so that the opening 320 and the floor slab 306 are accurately presented in a GUI.

AROs can be created by a user interacting with the GUI or automatically generated as a result of structural analysis of the CAD model. In some implementations, information describing reinforcement structures 342, analytical elements 340, physical elements 338, or combinations of these, can be provided by an export component 346 to one or more analysis applications 350 which can perform a structural analysis on behalf of the system 360 Various structural analysis programs can be used, and assorted types of analysis can be performed, including concrete design analysis, lateral load analysis, gravity load analysis, beam design analysis, steel design analysis, dynamic analysis, seismic analysis and steel connection design analysis.

In some implementations, the export component 346 can exchange information with analysis applications 350 using the Green Building XML (gbXML) document format. In further implementations, the information provided to an analysis program 350 can include an analytical representation of the physical elements 338 (i.e., the analytical elements 340). The analytical elements can include or be associated with properties, for example: geometry and location of analytical elements, moments of inertia, sheer capacity, connectivity or end conditions (e.g., pinned, fixed, free), material properties, reference to one or more corresponding physical elements, and release conditions. The analytical representation can also include any applicable construction codes 352 that could be used to guide the analysis and results generated there from.

The analytical representation can be subjected to load simulation and the like in a analysis program 350, for example, to identify stress levels in the various elements. The analysis application 350 can perform a stress analysis and the result of the stress analysis can determine how much reinforcement is required in a given physical element. For example, the analysis application 350 can determine that number four concrete reinforcement bars (0.668 pound per foot and 0.500 inch diameter) at a spacing of six inches apart are required (i.e., three inches of reinforcement per square foot) for a given floor slab. The analysis application 350 does not need a representation of the AROs 112 themselves. The analysis application 350 does, however, need the forces in order to be able to size and space reinforcement structures it deems appropriate.

The results of the analysis can then imported into the system 360. On the basis of the analysis, physical elements may be modified (e.g., resized or other properties changed) by the physical element modifier component 344, and reinforcement structures (as represented by AROs) may need to be modified or created by the ARO creator/modifier component 348. As the CAD model evolves, users can iterate doing analysis and automatically importing the changes from analysis to the system 360.

It should be noted that all components that are illustrated can be executed on the same computing device, on different computing devices connected by one or more networks, and can include more components or fewer components than illustrated.

Figure 4:
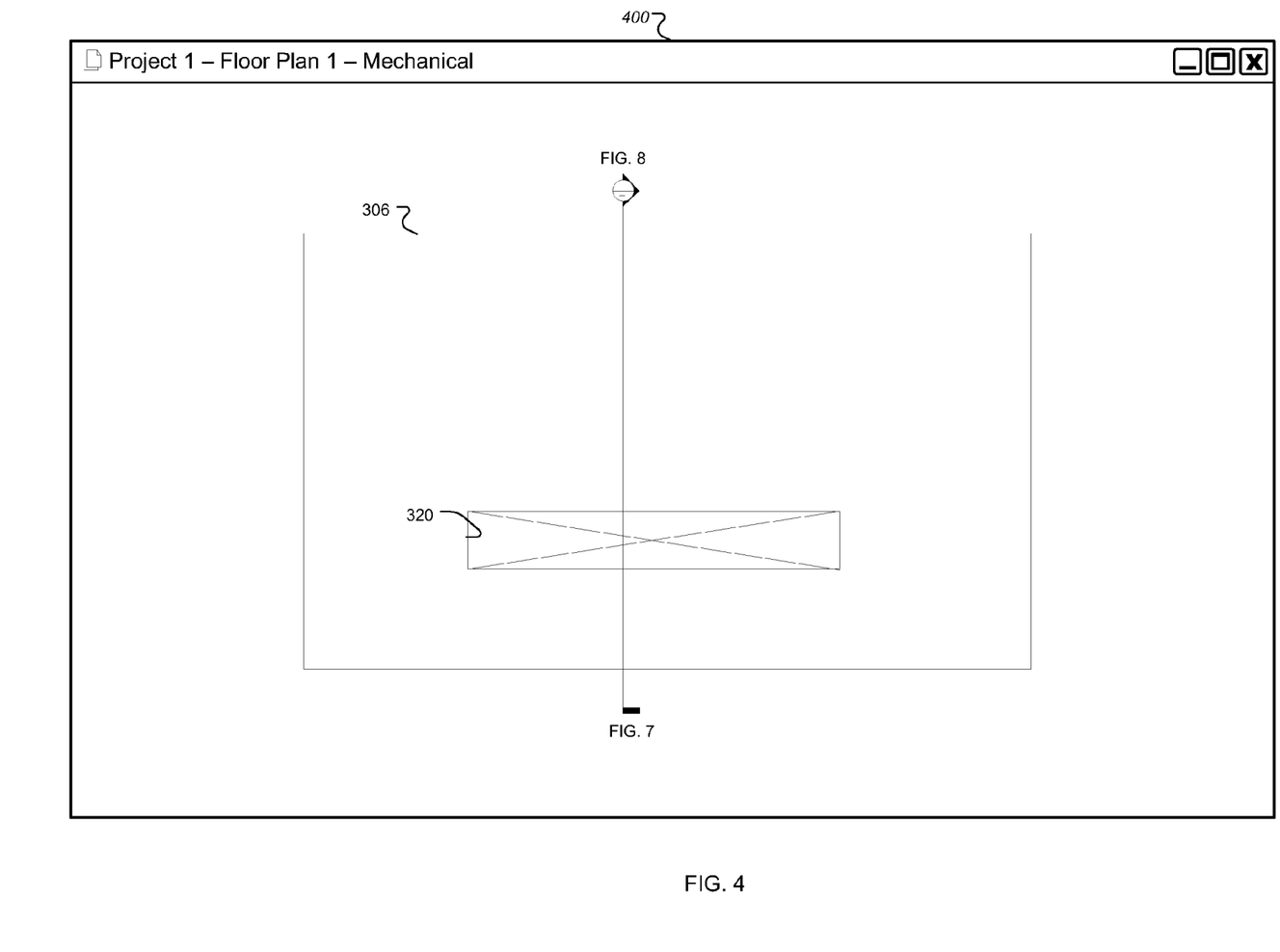
FIG. 4 shows an interactive plan view of a floor slab.

FIG. 4 shows an interactive plan view 400 of the floor slab 306. The floor slab 306 includes the opening 320. Through the view 400, users can manipulate the floor slab 306 and the opening 320 by, for example, changing physical element properties such as location and geometry. The floor slab 306 can act as a host for one or more AROs which represent reinforcement of the floor slab 306. An ARO hosted by the floor slab 306 is capable of representing a reinforcement structure that automatically accommodates the opening 320, even if the opening 320 is moved or resized.

Figure 5:
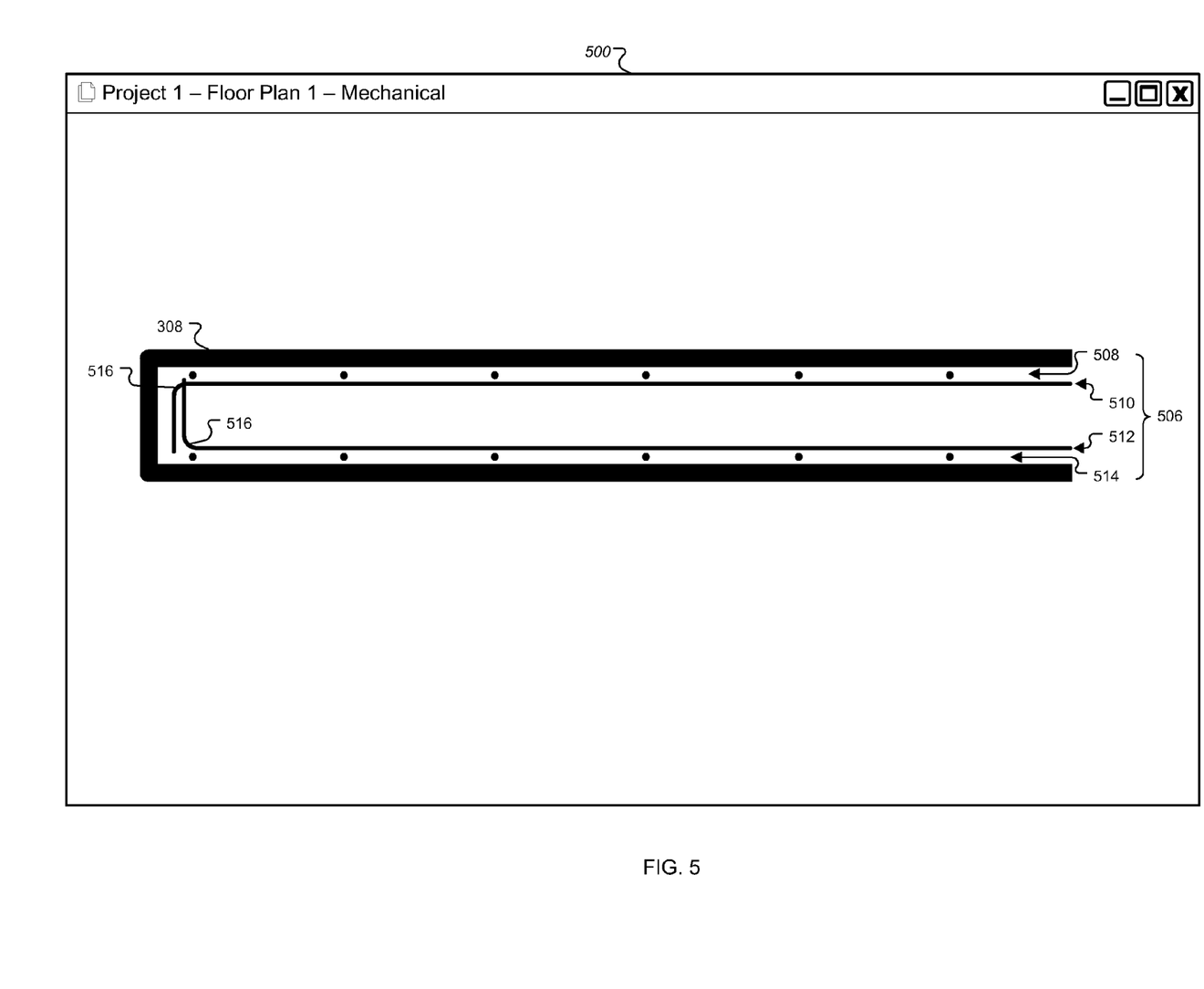
FIG. 5 shows an interactive sectional view of floor slab.

FIG. 5 shows an interactive sectional view 500 of the floor slab 306. The view 500 exposes a reinforcement structure 506 which is rendered by one or more AROs hosted by the floor slab 308. The reinforcement structure 506 typically has an even number of layers in the case of concrete reinforcement. The number of layers can be dependant upon the tensile and the compressive stresses in the concrete, and the thickness of the concrete, for example. In some implementations, the configuration of reinforcement structures is determined by the analysis application 350.

Rebar in a given layer can have an end condition (i.e., a bend or hook at its one or both of its ends). End conditions secure rebar in concrete like an anchor such that the rebar cannot be pulled out of the concrete. End conditions can also serve to create securing interactions between layers in the same physical element or in different physical elements. For example, for the rebar in the floor slab 306 to interact with the rebar in the wall 314, the rebar in the wall 314 includes an end condition or the rebar in the floor slab 306 includes an end condition, or both, such that the two reinforcement structures can be tied together. As a result, there would be at least three AROs: one for the wall 314, one for the floor slab 306, and one connecting the floor slab 306 and the wall 314.

Figure 6:
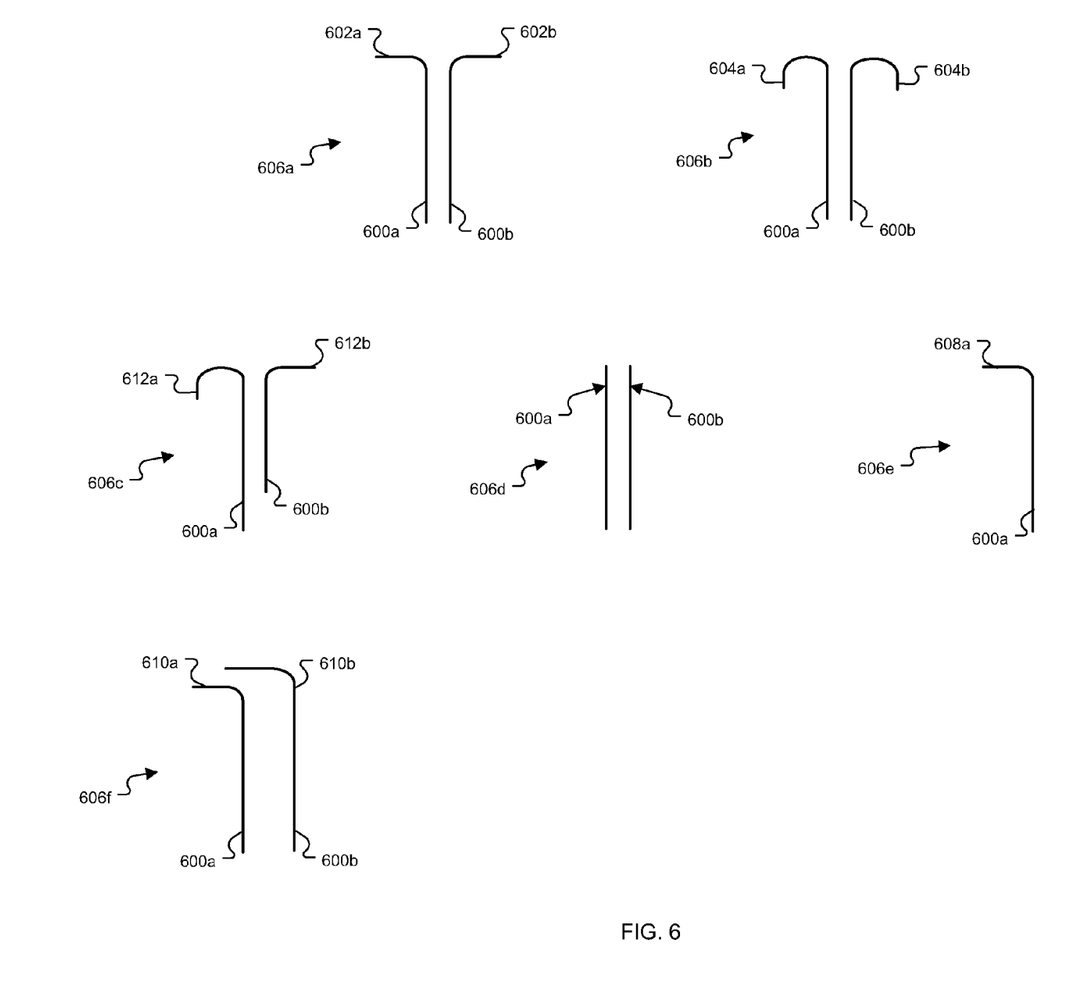
FIG. 6 shows possible end condition combinations for adjacent rebar.

In this example, the reinforcement structure 506 has four layers: 508, 510, 512 and 514. Rebar in layers 510 and 512 are orthogonal to a user's point of view whereas rebar in layers 508 and 514 run parallel to a user's point of view. The rebar which are parallel to the user's point of view are drawn as rebar which has been "cut" along the plane of the sectional view 500. In some implementations, rebar ends can be depicted as ovals or circles. In this illustration, an end condition 516 exists in the top and bottom layers 510 and 512 (which are shown offset from each other in the view 500 so users can see the end condition). The AROs can be configured to represent different types of rebar end conditions as illustrated in FIG. 6. In addition, end conditions can be created automatically as a result of importing analysis results from an analysis program 350. Moreover, end condition information can be exported to analysis programs 350.

FIG. 6 illustrates possible end condition combinations for adjacent rebar which can be represented by AROs, however other combinations are possible. Combination 606a shows a pair of rebar 600a-b that include bends that form opposite perpendicular hook end conditions 602a-b on the distal portions of the rebar 600a-b. Combination 606b shows rebar 600a-b that include opposite curved hook end conditions 604a-b. Combination 606c shows a pair of rebar 600a-b with different opposite end conditions. Rebar 600a has a curved hook 612a end condition whereas rebar 600b has a perpendicular hook 612b end condition. Combination 606d illustrates a pair of rebar 600a-b with no end conditions. A single rebar 600a is illustrated with a perpendicular hook end condition 608a. Finally, combination 606f shows a pair of rebar 600a-b having perpendicular end conditions 610a-b where the end conditions are in the same direction.

Figure 7:
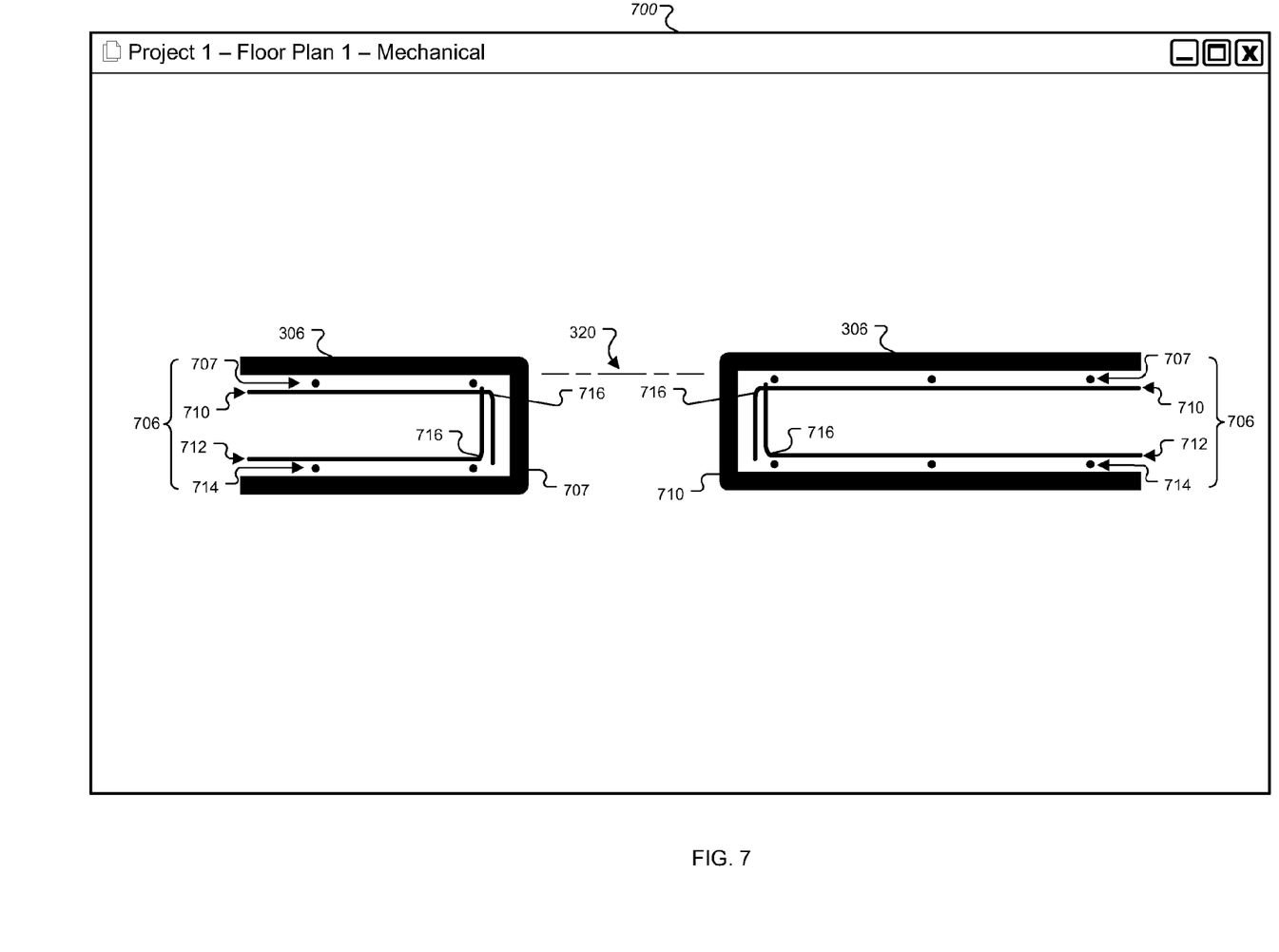
FIG. 7 shows an interactive sectional view of an opening in a floor slab.

FIG. 7 shows an interactive sectional view 700 of the opening 320 in the floor slab 306. In this example, the reinforcement structure 706 is a four layer structure that includes layers 707, 710, 712 and 714 which are rendered as rebar in view 700. Rebar in layers 710 and 712 are orthogonal to a user's point of view whereas rebar in layers 707 and 714 run parallel to a user's point of view. The rebar which are parallel to the user's point of view are drawn as rebar which has been "cut" along the plane of the sectional view 700. The rebar is rendered so that the rebar terminates correctly at openings, such as opening 320. For example, rebar 710 and 712 including end conditions 716 near opening 320.

AROs hosted by the floor slab 306 are able to obtain the floor slab 306's properties such as the slab 306's dimensions and the location and dimensions of any openings in the slab. Using this information, the AROs can determine how to render reinforcement structures such that the structures route around openings. As described above, this includes correctly rendering end conditions where needed and "cuts" in the reinforcement structures as necessitated by the view 700.

Figure 8:
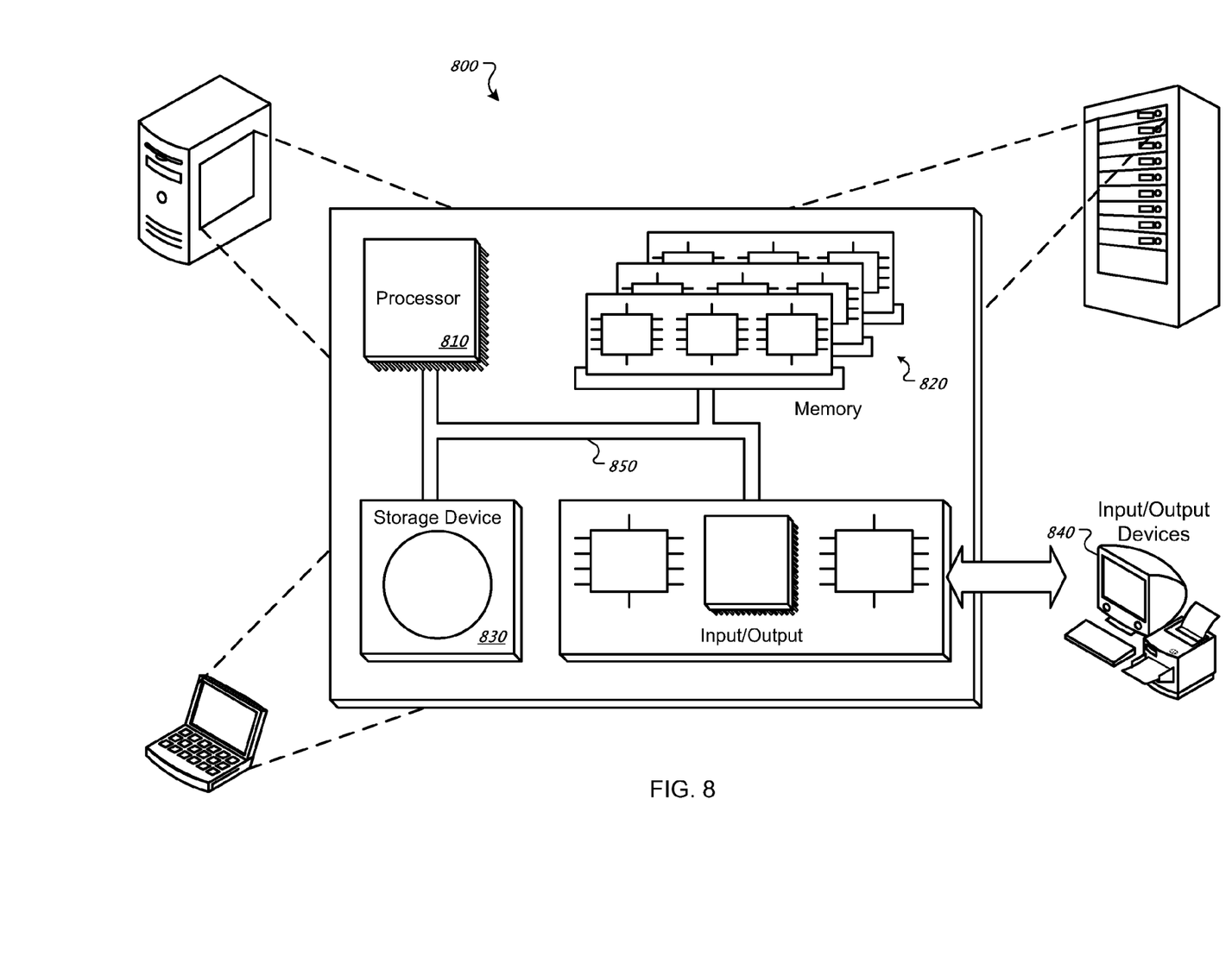
FIG. 8 is a schematic diagram of a generic computer system.

FIG. 8 is a schematic diagram of a generic computer system 800. The system 800 can be used for practicing operations described in association with the techniques 100 and 200. The system 800 can include a processor 810, a memory 820, a storage device 830, and input/output devices 840. Each of the components 810, 820, 830, and 840 are interconnected using a system bus 850. The processor 810 is capable of processing instructions for execution within the system 800. Such executed instructions can implement one or more components of system 500, for example. In one implementation, the processor 810 is a single-threaded processor. In another implementation, the processor 810 is a multi-threaded processor. The processor 810 is capable of processing instructions stored in the memory 820 or on the storage device 830 to display graphical information for a user interface on the input/output device 840.

The memory 820 is a computer readable medium such as volatile or non volatile that stores information within the system 800. The memory 820 could store data structures representing physical elements 338, analytical representations 340, and AROs 342, for example. The storage device 830 is capable of providing persistent storage for the system 800. The storage device 830 may be a floppy disk device, a hard disk device, an optical disk device, or a tape device, or other suitable persistent storage means. The input/output device 840 provides input/output operations for the system 800. In one implementation, the input/output device 840 includes a keyboard and/or pointing device. In another implementation, the input/output device 840 includes a display unit for displaying graphical user interfaces.

The input/output device 840 can provide input/output operations for a CAD system. The CAD system can be, for example, CAD tool is Autodesk® Revit® Structure, available from Autodesk, Inc. of San Rafael, Calif., or another CAD application or other software application. The CAD system can include computer software components that manage AROs. Examples of such software components include the user interface 332, change engine 336, presentation engine 334, ARO creator/modifier 348, export component 346, and the physical element modifier 344. Such software components can be persisted in storage device 830, memory 820 or can be obtained over a network connection, to name a few examples. Embodiments of the invention and all of the functional operations described in this specification can be implemented in digital electronic circuitry, or in computer software, firmware, or hardware, including the structures disclosed in this specification and their structural equivalents, or in combinations of one or more of them.

Embodiments of the invention can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the invention, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. For example, the actions recited in the claims can be performed in a different order and still achieve desirable results.

What is claimed is:

1. A computer-implemented method, comprising:
providing a view of a physical element, the physical element represented in a computer aided design (CAD) model;
determining a structural reinforcement appearance for the physical element where the appearance includes an arrangement of bars in one or more layers as determined by a structural analysis of the CAD model;
integrating the appearance of the structural reinforcement into the view of the physical element, where the bars do not have corresponding physical elements in the CAD model;
receiving a modification of the physical element; and
modifying the appearance of the structural reinforcement to reflect the modification to the physical element, where the modifying is performed by one or more processors.

2. The method of claim 1, where:
the appearance of the structural reinforcement is apparent in the view of the physical element when the view exposes no interior portion of the physical element.

3. The method of claim 1, where:
the appearance of the structural reinforcement is apparent in the view of the physical element when the view exposes one or more interior portions of the physical element.

4. The method of claim 1, where:
the appearance of the structural reinforcement accommodates one or more openings in the physical element.

5. The method of claim 1, where:
the appearance of the structural reinforcement represents a concrete or a frame reinforcement.

6. The method of claim 1, where:
the physical element is one of: a wall, a floor slab, and a column.

7. A system, comprising:
one or more computers; and
a computer-readable medium coupled to the one or more computers having instructions stored thereon which, when executed by the one or more computers, cause the one or more computers to perform operations comprising:
providing a view of a physical element, the physical element represented in a computer aided design (CAD) model;

determining a structural reinforcement appearance for the physical element where the appearance includes an arrangement of bars in one or more layers as determined by a structural analysis of the CAD model;

integrating the appearance of the structural reinforcement into the view of the physical element, where the bars do not have corresponding physical elements in the CAD model;

accepting a modification of the physical element;

modifying the appearance of the structural reinforcement to reflect the modification of the physical element; and where the modifying is performed by one or more processors.

8. The system of claim 7, where:

the appearance of the structural reinforcement is apparent in the view of the physical element when the view exposes no interior portion of the physical element.

9. The system of claim 7, where:

the appearance of the structural reinforcement is apparent in the view of the physical element when the view exposes one or more interior portions of the physical element.

10. The system of claim 7, where:

the appearance of the structural reinforcement accommodates one or more openings in the physical element.

11. The system of claim 7, where:

the appearance of the structural reinforcement represents a concrete or a frame reinforcement.

12. The system of claim 7, where:

the physical element is one of: a wall, a floor slab, and a column.

13. A computer storage medium encoded with a computer program, the computer program comprising instructions that when executed by a data processing apparatus to perform operations comprising:

providing a view of a physical element, the physical element represented in a computer aided design (CAD) model;

determining a structural reinforcement appearance for the physical element where the appearance includes an arrangement of bars in one or more layers as determined by a structural analysis of the CAD model;

integrating the appearance of the structural reinforcement into the view of the physical element, where the bars do not have corresponding a physical elements in the CAD model;

receiving a modification of the physical element; and modifying the appearance of the structural reinforcement to reflect the modification to the physical element.

14. The computer storage medium of claim 13, where:

the appearance of the structural reinforcement is apparent in the view of the physical element when the view exposes no interior portion of the physical element.

15. The computer storage medium of claim 13, where:

the appearance of the structural reinforcement is apparent in the view of the physical element when the view exposes one or more interior portions of the physical element.

16. The computer storage medium of claim 13, where:

the appearance of the structural reinforcement accommodates one or more openings in the physical element.

17. The computer storage medium of claim 13, where:

the appearance of the structural reinforcement represents concrete or frame reinforcement.

18. The computer storage medium of claim 13, where:

the physical element is one of: a wall, a floor slab, and a column.

\* \* \* \* \*

UNITED STATES PATENT AND TRADEMARK OFFICE
CERTIFICATE OF CORRECTION

| | | |
|---|---|---|
| PATENT NO. | : 7,856,342 B1 | Page 1 of 1 |
| APPLICATION NO. | : 11/619565 | |
| DATED | : December 21, 2010 | |
| INVENTOR(S) | : Emile E. Kfouri and Timothy D. Culver | |

It is certified that error appears in the above-identified patent and that said Letters Patent is hereby corrected as shown below:

Column 14, line 10, before "physical" delete "a"

Signed and Sealed this
Eighth Day of March, 2011

David J. Kappos
*Director of the United States Patent and Trademark Office*